(12) United States Patent
Colvin

(10) Patent No.: US 8,242,469 B2
(45) Date of Patent: Aug. 14, 2012

(54) ADJUSTABLE LOUVERED PLASMA ELECTRON FLOOD ENCLOSURE

(75) Inventor: Neil K. Colvin, Merrimack, NH (US)

(73) Assignee: Axcelis Technologies, Inc., Beverly, MA (US)

( * ) Notice: Subject to any disclaimer, the term of this patent is extended or adjusted under 35 U.S.C. 154(b) by 241 days.

(21) Appl. No.: 12/835,138

(22) Filed: Jul. 13, 2010

(65) Prior Publication Data
US 2011/0012033 A1    Jan. 20, 2011

Related U.S. Application Data

(60) Provisional application No. 61/225,843, filed on Jul. 15, 2009.

(51) Int. Cl.
  *H01J 37/317* (2006.01)
  *H01J 37/02* (2006.01)
(52) U.S. Cl. ............. 250/492.21; 250/251; 250/505.1
(58) Field of Classification Search ............ 250/251, 250/281, 396 R, 397, 400, 423, 492.2, 492.21, 250/492.22, 492.23, 492.3, 505.1, 526
See application file for complete search history.

(56) References Cited

U.S. PATENT DOCUMENTS

| | | | |
|---|---|---|---|
| 4,578,589 A * | 3/1986 | Aitken | 250/492.2 |
| 4,847,504 A * | 7/1989 | Aitken | 250/492.2 |
| 5,389,793 A * | 2/1995 | Aitken et al. | 250/492.21 |
| 6,525,326 B1 | 2/2003 | Harrington et al. | |
| 6,833,322 B2 * | 12/2004 | Anderson et al. | 438/680 |
| 7,586,111 B2 * | 9/2009 | Sieradzki et al. | 250/492.21 |
| 7,842,934 B2 * | 11/2010 | Tekletsadik et al. | 250/492.21 |
| 8,124,947 B2 * | 2/2012 | Sieradzki et al. | 250/492.21 |
| 2008/0157007 A1 * | 7/2008 | Nunan et al. | 250/492.2 |
| 2011/0240889 A1 * | 10/2011 | Colvin et al. | 250/492.21 |

* cited by examiner

*Primary Examiner* — Bernard E Souw
(74) *Attorney, Agent, or Firm* — Eschweiler & Associates, LLC

(57) ABSTRACT

An apparatus is provided for reducing particle contamination in an ion implantation system. The apparatus has an enclosure having an entrance, an exit, and at least one louvered side having a plurality of louvers defined therein. A beamline of the ion implantation system passes through the entrance and exit, wherein the plurality of louvers of the at least one louvered side are configured to mechanically filter an edge of an ion beam traveling along the beamline. The enclosure can have two louvered sides and a louvered top, wherein respective widths of the entrance and exit of the enclosure, when measured perpendicular to the beamline, are generally defined by a position of the two louvered sides with respect to one another. One or more of the louvered sides can be adjustably mounted, wherein the width of one or more of the entrance and exit of the enclosure is controllable.

23 Claims, 11 Drawing Sheets

ADJUSTABLE LOUVERED PLASMA ELECTRON FLOOD ENCLOSURE

REFERENCE TO RELATED APPLICATION

This application claims priority to and the benefit of U.S. Provisional Application Ser. No. 61/225,843 which was filed Jul. 15, 2009, entitled, "ADJUSTABLE LOUVERED PLASMA ELECTRON FLOOD ENCLOSURE", the contents of which is hereby incorporated by reference in its entirety as if fully set forth herein.

FIELD OF THE INVENTION

The present invention relates generally to ion implantation systems, and more specifically to systems and methods for controlling particulate contamination in an ion implantation system.

BACKGROUND OF THE INVENTION

In the manufacture of semiconductor devices and other products, ion implantation systems are used to impart impurities, known as dopant elements, into semiconductor wafers, display panels, or other workpieces. Conventional ion implantation systems or ion implanters treat a workpiece with an ion beam in order to produce n- or p-type doped regions, or to form passivation layers in the workpiece. When used for doping semiconductors, the ion implantation system injects a selected ion species to produce the desired extrinsic material. For example, implanting ions generated from source materials such as antimony, arsenic, or phosphorus results in n-type extrinsic material wafers. Alternatively, implanting ions generated from materials such as boron, gallium, or indium creates p-type extrinsic material portions in a semiconductor wafer.

Conventional ion implantation systems include an ion source that ionizes a desired dopant element which is then accelerated to form an ion beam of prescribed energy. The ion beam is directed at a surface of the workpiece to implant the workpiece with the dopant element. The energetic ions of the ion beam penetrate the surface of the workpiece so that they are embedded into the crystalline lattice of the workpiece material to form a region of desired conductivity. The implantation process is typically performed in a high vacuum process chamber which prevents dispersion of the ion beam by collisions with residual gas molecules and which minimizes the risk of contamination of the workpiece by airborne particulates.

Ion dose and energy are two variables commonly used to define an ion implantation. The ion dose is associated with the concentration of implanted ions for a given semiconductor material. Typically, high current implanters (generally greater than 10 milliamps (mA) ion beam current) are used for high dose implants, while medium current implanters (generally capable up to about 1 mA beam current) are used for lower dose applications. Ion energy is used to control junction depth in semiconductor devices. The energy of the ions which make up the ion beam determine the degree of depth of the implanted ions. High energy processes, such as those used to form retrograde wells in semiconductor devices, typically require implants of up to a few million electron volts (MeV), while shallow junctions may only demand energies below 1 thousand electron volts (keV).

The continuing trend to smaller and smaller semiconductor devices requires implanters with ion sources that serve to deliver high beam currents at low energies. The high beam current provides the necessary dosage levels, while the low energy levels permit shallow implants. Source/drain junctions in complementary metal-oxide-semiconductor (CMOS) devices, for example, require such a high current, low energy application.

SUMMARY OF THE INVENTION

The present invention overcomes the limitations of the prior art by providing a method for reducing particle contamination in an ion implantation system. Consequently, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is directed generally toward an apparatus and method for reducing particle contamination in an ion implantation system. In accordance with one aspect, an apparatus is provided comprising an enclosure that is configured to reside along a beamline of the ion implantation system. The enclosure has an entrance, an exit, and at least one side having a plurality of louvers defined therein. The plurality of louvers, for example, are angled less than approximately 90 degrees with respect to the ion beam when measured in a direction of travel of the ion beam. In one particular example, the plurality of louvers are angled between approximately 45 and 55 degrees with respect to the beamline.

The enclosure, for example, is comprised of carbon, wherein contamination to the beamline is minimized. In another example, the enclosure is grounded or is provided at a bias voltage with respect to the ion implantation system. The beamline enters the enclosure via the entrance and exits the enclosure via the exit, wherein the plurality of louvers of the at least one louvered side are configured to mechanically filter an edge of an ion beam traveling along the beamline. The enclosure, in another example, comprises a plasma electron flood enclosure, wherein one or more electrodes are configured to supply electrons to the ion beam within the plasma electron flood enclosure, therein controlling a charge on the substrate being implanted.

In one particular example, the enclosure comprises two louvered sides positioned generally opposite one another. The entrance and exit of the enclosure, for example, when measured perpendicular to the beamline, are generally defined by a position of the two louvered sides with respect to one another. The at least one of the louvered side, in another example, is adjustably mounted, wherein the width of one or more of the entrance and exit of the enclosure is adjustable and controlled based on the position of the at least one louvered side. For example, two louvered sides each comprise a respective pivot axis associated with the entrance of the enclosure, wherein the two louvered sides are configured to pivot about the respective pivot axis, therein controlling the width of the exit of the enclosure. A control of a position of at least one of the louvered sides, for example, therein controls the width of one or more of the entrance and exit of the enclosure.

In another example, the enclosure comprises two louvered sides that lie in non-parallel planes with respect to one another, wherein the width of the entrance of the enclosure is generally defined by a width of a resolving aperture upstream of the enclosure, and the width of the exit of the enclosure is generally defined by an exit aperture of the beamline immediately upstream of a workpiece.

In accordance with yet another example, the enclosure further comprises a top side generally enclosing a top portion of the enclosure between the two louvered sides. The top side, for example, comprises either a perforated or a non-perforated plate comprised of carbon. In another example, the top side has a plurality of louvers defined therein. A position of the top side of the enclosure, for example, generally defines one or more of an upstream aperture (e.g., the entrance) and a downstream aperture (e.g., the exit) of the enclosure. For example, the louver nearest the entrance of the enclosure generally provides a beam defining aperture, wherein beam-strike and subsequent sputtering and/or plating is minimized or eliminated on downstream components. A bottom side generally enclosing a bottom portion of the enclosure is further provided in still another example, wherein the bottom side generally extends between the two louvered sides. The bottom side, for example, comprises a plurality of perforations, wherein the plurality of perforations are operable to permit contaminants to exit the enclosure via gravity.

A method for reducing particle contamination is further provided, wherein the plurality of louvers of the at least one louvered side mechanically filter an edge of the ion beam and remove one or more contaminants from the beamline.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
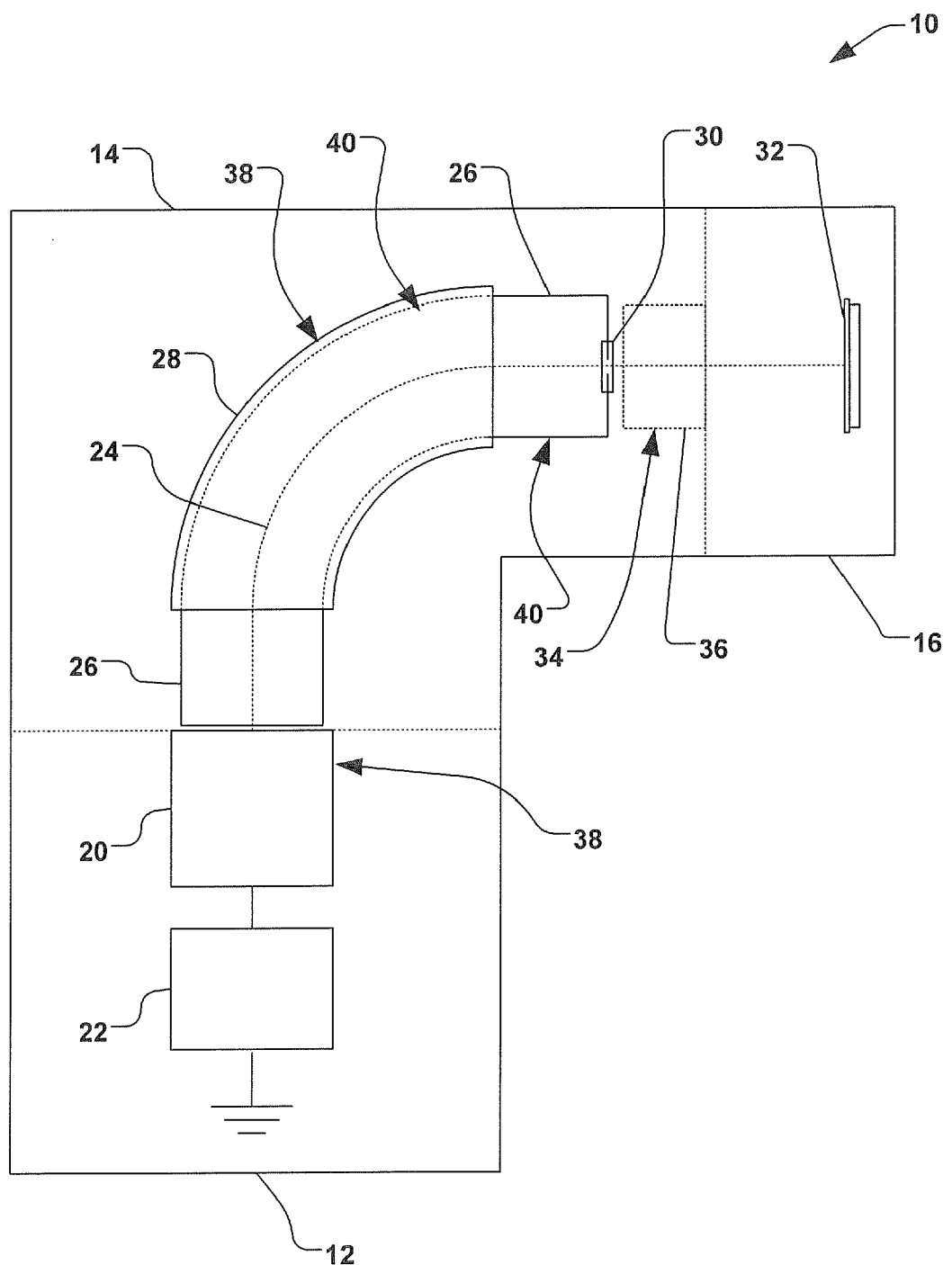
FIG. 1 is a plan view of a conventional ion implantation system.

The present invention is directed generally towards an apparatus and method for reducing particle contamination during an implantation of ions into one or more workpieces. More particularly, the method provides an enclosure provided along a beamline of an ion implantation system, wherein a plurality of louvers generally decrease particle contamination at the workpiece. Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

An exemplary ion implantation system 10 is illustrated in FIG. 1, wherein the ion implantation system comprises a terminal 12, a beamline assembly 14, and an end station 16. The terminal 12 includes a suitable ion source 20 powered by a power supply 22, wherein the terminal is configured to produce and directs an ion beam 24 through the beamline assembly 14, and ultimately, to the end station 16. The beamline assembly 14, for example, has a beamguide 26 and a mass analyzer 28 associated therewith, wherein a dipole magnetic field is established to pass only ions of appropriate charge-to-mass ratio through an aperture 30 at an exit end of the beamguide 26 to a workpiece 32 (e.g., a semiconductor wafer, display panel, etc.) disposed in the end station 16.

In some instances, such as a short beamline, high-current pencil beam ion implantation system, a plasma electron flood (PEF) 34 is utilized just upstream of the workpiece 32 in order to control charges on the workpiece, as well as to control space charge and eliminate beam blow-up. The inventor appreciates that the utilization of a PEF 34, however, involves an enclosure 36 in which the plasma is formed. The enclosure 36, for example, minimizes electron losses and encloses the plasma flood, therein generally preventing an ionizing gas (not shown) utilized in the PEF 34 from contacting high voltage features (not shown) elsewhere in the system 10, thus attempting to contain particle and metal contamination throughout the ion implantation system.

During the implantation of ions into the workpiece 32, however, various contaminants (not shown) are typically generated from the ion beam 24 over time, and strike and adhere or deposit on various components 38, such as the aperture 30 and PEF enclosure 36 disposed along the beam path. Collisions of ions with the various components 38, for example, can further sputter contaminants (not shown) onto other surfaces 40 situated along the beam path, and the ion beam 24 can further transport the contaminants to the workpiece 32.

Figure 2:
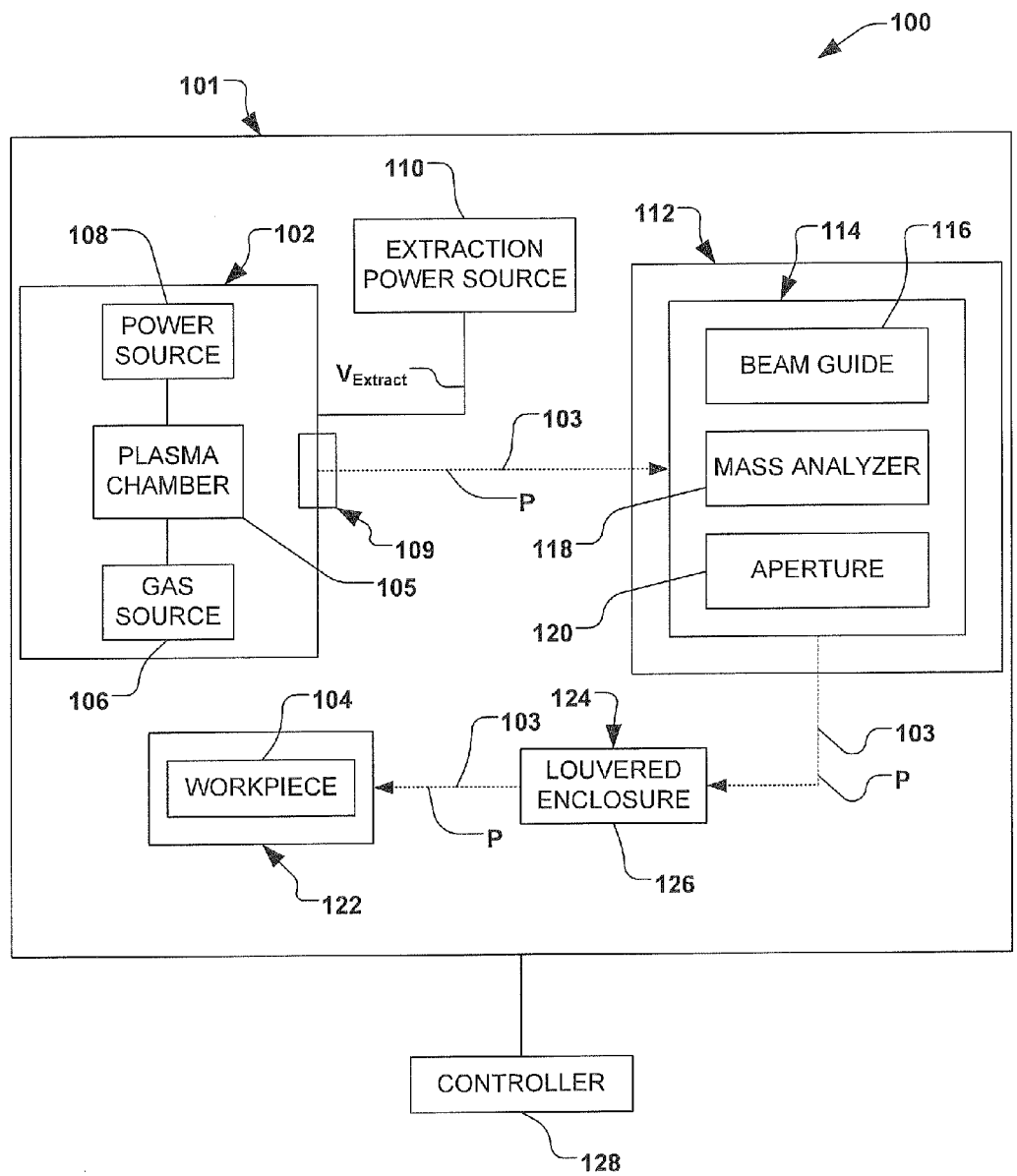
FIG. 2 is a system-level block diagram of an exemplary ion implantation system according to one aspect of the present invention.

FIG. 2 illustrates another exemplary ion implantation system 100 depicted in block diagram form, wherein the exemplary ion implantation system is suitable for implementing one or more aspects of the present invention. The system 100 comprises an ion implantation apparatus 101 comprising an ion source 102 for producing a quantity of ions operable to travel along a path or beamline P, thus defining an ion beam 103 for implantation of the ions into a workpiece 104 (e.g., a semiconductor wafer, display panel, etc.). The ion source 102, for example, generally comprises a plasma chamber 105, a process gas source 106, and a power source 108, wherein positively charged ions are generated from the process gas within the plasma chamber by an application of power from the power source. The process gas source 106 may comprise a source material such as an ionizable gas or vaporized solid source material or species that has been previously vaporized. For an n-type implantation into the workpiece 104, for example, the source materials may comprise boron, gallium or indium. For a p-type implantation, for example, the source materials may comprise arsenic, phosphorus, or antimony.

The ion source 102 further comprises an extraction assembly 109 associated therewith, wherein charged ions are extracted from the ion source upon an application of an extraction voltage $V_{Extract}$ thereto. An extraction power source 110 is operable to provide the extraction voltage $V_{Extract}$, wherein the extraction voltage may be further modulated. A beamline assembly 112 is further provided downstream of the ion source 102, wherein the beamline assembly generally receives the charged ions. The beamline assembly 112, for example, comprises one or more components 114, such as a beamguide 116, a mass analyzer 118, and an aperture 120, wherein the one or more components are operable to form and shape the ion beam 103.

The mass analyzer 118, for example, further comprises a field generating component, such as a magnet (not shown), wherein the mass analyzer generally provides a magnetic field across the ion beam 103, thus deflecting ions from the ion beam at varying trajectories according to a charge-to-mass ratio of the ions. For example, ions traveling through the magnetic field experience a force that directs individual ions of a desired charge to mass ratio along the beam path P and deflects ions of undesired charge to mass ratios away from the beam path. Once through the mass analyzer 118, the ion beam 103 is directed though the aperture 120, wherein the ion beam is generally limited to produce a concise beam for implantation into the workpiece 104.

The ion implantation system 100 further comprises an end station 122, wherein the workpiece 104 generally resides. In the manufacture of integrated circuit devices, display panels, and other products, it is generally desirable to uniformly implant dopant species across the entire surface of the workpiece 104. The ion implantation apparatus 101 can therefore be configured to implant ions into a single workpiece 104 (e.g., a "serial" ion implanter), wherein the workpiece generally resides on a pedestal or chuck (not shown) situated within the end station 122. Alternatively, the ion implantation apparatus 101 can be configured to implant ions into multiple workpieces 104 (e.g., a "batch" ion implanter), wherein the end station 122 comprises a rotating platter (not shown), whereon several workpieces are translated with respect to the ion beam 103. It should be noted that any ion implantation apparatus operable to extract ions from an ion source and implant them into one or more workpieces is contemplated as falling within the scope of the present invention. The present invention, however, has shown particular usefulness in ion implantation systems 100 have relatively short beamline lengths (e.g., a high current ion implantation system).

The ion implantation apparatus 101, in one example, further comprises a louvered enclosure 124 generally situated along the path P of the ion beam 103. In one example, the louvered enclosure 124 generally resides between the beamline assembly 112 and the end station 122, however, the louvered enclosure can alternatively reside between the plasma chamber 105 and the mass analyzer 118. The louvered enclosure 124, for example, is operable to mechanically filter or "clip" edges of the ion beam 103 prior to the ion beam entering the end station 122, as will be described in further detail infra. In one particular example, the louvered enclosure 124 comprises a plasma electron flood (PEF) enclosure 126 positioned downstream of the aperture 120 along the ion beam path P, wherein the PEF enclosure is configured to provide electrons to the ion beam 103 and also to control space charges associated with the ion beam to in order to control ion beam blow-up or expansion and control charge build up on the workpiece 104 being implanted.

The ion implantation system 100 further comprises a controller 128, wherein the controller is operable to control the ion implantation apparatus 101. For example, the controller 128 is operable to control the power source 108 for producing the ions, as well as the extraction power source 110, wherein the ion beam path P is generally controlled. The controller 128 is further operable to adjust the strength and orientation of the magnetic field associated with the mass analyzer 118, among other things. In another example, the controller 128 is further operable to control a position of the workpiece 104 within the ion implantation apparatus 101, and can be further configured to control a position and/or orientation of the louvered enclosure 124 with respect to the ion beam path P. It will be appreciated that the controller 128 may comprise a processor, computer system, and/or operator for overall control of the system 100 (e.g., a computer system in conjunction with input by an operator).

Figure 3:
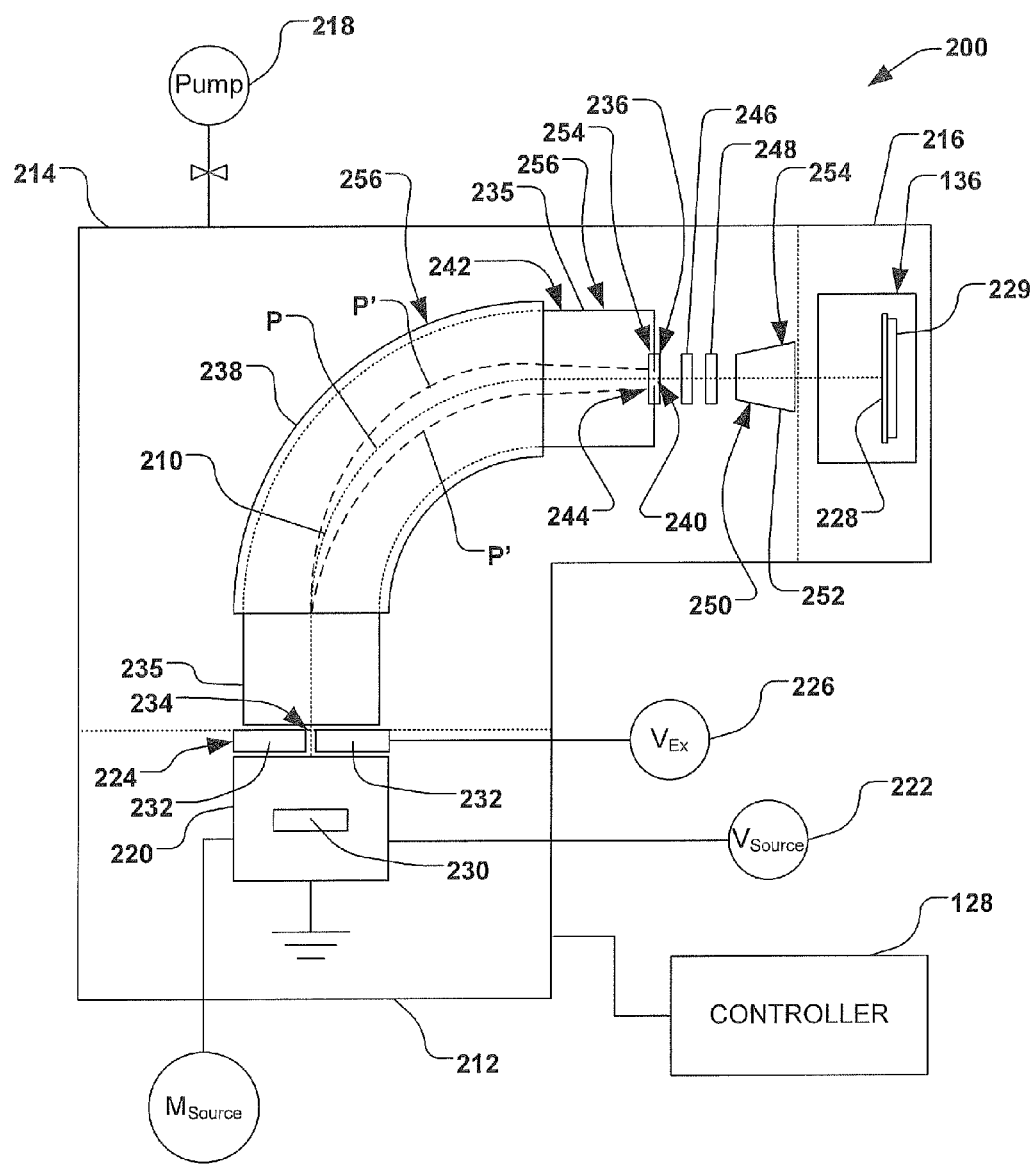
FIG. 3 is a plan view of an exemplary ion implantation system according to another aspect of the present invention.
Figure 4:
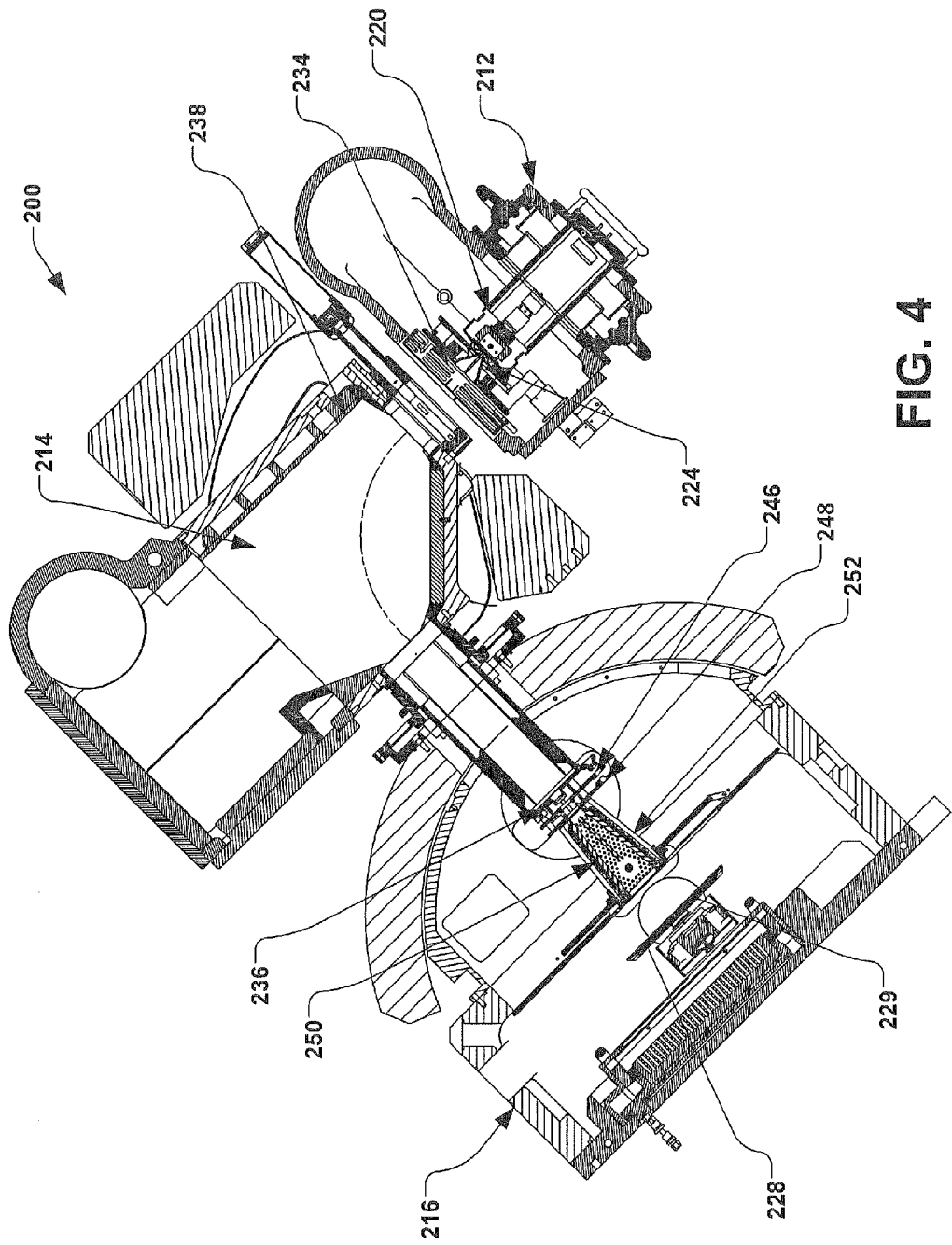
FIG. 4 is a detailed plan view of another exemplary ion implantation system according to yet another aspect of the invention.

Referring now to FIG. 3, an exemplary ion implantation apparatus 200 is illustrated, such as the apparatus 101 in FIG. 2, wherein the exemplary ion implantation apparatus is shown in greater detail. FIG. 4 illustrates the ion implantation apparatus 200 in even greater detail. It should be again noted that although the ion implantation apparatus 200 is illustrated as one example, the present invention can be practiced using various other types of ion implantation apparatus and systems, such as high energy systems, low energy systems, or other implantation systems, and all such systems are contemplated as falling within the scope of the present invention.

The ion implantation system 200 of FIGS. 3 and 4, for example, comprises a terminal 212, a beamline assembly 214, and an end station 216 (e.g., collectively termed a process chamber), wherein the ion implantation system is generally placed under vacuum by one or more vacuum pumps 218 illustrated in FIG. 3. The terminal 212, for example, comprises an ion source 220 powered by a source power supply 222, and an extraction assembly 224 powered by an extraction power supply 226 to extract ions from the ion source 220 and thereby to provide the extracted ion beam 210 to the beamline assembly 214. The extraction assembly 224, in conjunction with the beamline assembly 214, for example, are operable to direct the ions toward a workpiece 228 residing on a support 229 in the end station 216 for implantation thereof at a given energy level.

In one example, the ion source 220 comprises a plasma chamber (not shown) wherein ions of a process material $M_{source}$ are energized at a high positive potential $V_{source}$. It should be noted that generally, positive ions are generated, although the present invention is also applicable to systems wherein negative ions are generated by the source 220. The extraction assembly 224 further comprises a plasma electrode 230 and one or more extraction electrodes 232, wherein the plasma electrode is biased with respect to the one or more extraction electrodes, but floats with respect to the plasma within the ion source 220 (e.g., the plasma electrode at 120 kV with respect to the workpiece 228, wherein the workpiece is typically grounded). The one or more extraction electrodes 232, for example, are biased at a voltage less than that of the plasma electrode 230 (e.g., an extraction voltage $V_{Extract}$ of 0-100 kV). The negative relative potential at the one or more extraction electrodes 232 with respect to the plasma creates an electrostatic field operable to extract and accelerate the positive ions out of the ion source 220. For example, the one or more extraction electrodes 232 have one or more extraction apertures 234 associated therewith, wherein positively charged ions exit the ion source 220 through the one or more extraction apertures to form the ion beam 210, and wherein a velocity of the extracted ions is generally determined by the potential $V_{Extract}$ provided to the one or more extraction electrodes.

The beamline assembly 214, according to one exemplary aspect of the invention, comprises a beamguide 235 having an entrance near the ion source 220 (e.g., associated with the extraction aperture 234) and an exit with a resolving plate 236, as well as a mass analyzer 238 that receives the extracted ion beam 210 and creates a dipole magnetic field to pass only ions of appropriate charge-to-mass ratio or range thereof (e.g., a mass analyzed ion beam having ions of a desired mass range) to the workpiece 228 positioned in the end station 216. The ionization of source materials in the ion source 220 generates a species of positively charged ions having a desired atomic mass. However, in addition to the desired species of ions, the ionization process will also generate a proportion of ions having other atomic masses as well. Ions having an atomic mass above or below the proper atomic mass are not suitable for implantation and are referred to as undesirable species. The magnetic field generated by the mass analyzer 238 generally causes the ions in the ion beam 210 to move in a curved trajectory, and accordingly, the magnetic field is established such that only ions having an atomic mass equal to the atomic mass of the desired ion species traverse the beam path P to the end station 216.

In accordance with another aspect of the invention, the resolving plate 236 at the exit of the beamguide 235 of FIG. 3 operates in conjunction with the mass analyzer 238 to eliminate undesirable ion species from the ion beam 210 which have an atomic mass close to, but not identical, to the atomic mass of the desired species of ions. The resolving plate 236, for example, is comprised of vitreous graphite or another material such as tungsten or tantalum, and includes one or more elongated apertures 240, wherein the ions in the ion beam 210 pass through the aperture as they exit the beamguide 235. At the resolving plate 236, a dispersion of ions from the path P of the ion beam 210 (e.g., illustrated at P') is at its minimum value, wherein a width of the ion beam (P'-P') is at a minimum where the ion beam 210 passes through the resolving aperture 240.

As explained above, the strength and orientation of the magnetic field of the mass analyzer 238 of FIG. 3, as well as the velocity of the ions extracted from the ion source 220, is established by the controller of FIG. 2, such that generally, only ions having an atomic weight equal to the atomic weight (or charge-to-mass ratio) of the desired species will traverse the predetermined, desired ion beam path P to the end station 216. Undesirable species of ions having an atomic mass much larger or much smaller than the desired ion atomic mass are sharply deflected and impact a housing 242 of the beamguide 235 of FIG. 3.

However, if the atomic mass of an undesirable ion closely approximates the atomic mass of the desired species, the trajectory of the undesirable ion will be only slightly deflected from the desired beam path P. Accordingly, such an undesirable ion having only a slight deflection from the desired beam path P would have a tendency to impact the upstream facing surface 244 of the resolving aperture 236. In a decelerated ion implantation system (called "decel mode"), the length of the beam path P is relatively short. In such a system, a decel suppression plate 246 of FIG. 4 is provided downstream of the resolving plate 236, wherein an electrical bias generally decelerates the ion beam and prevents electrons from traveling upstream along the beamline P. A ground plate 248 is further provided downstream of the decel suppression plate 246. When optics are implemented as a part of the decel suppression plate 246 and ground plate 248, for example, the ion beam can be further focused in the Y coordinate with the application of an appropriate voltage to the decel suppression plate.

In accordance with the present example, a louvered enclosure 250 is provided downstream of the resolving aperture 236 (e.g., also downstream of the decel suppression plate 246 and ground plate 248), wherein the louvered enclosure comprises a PEF enclosure 252. During operation of the ion implantation apparatus 200, contaminant materials such as undesirable species of ions, delamination of sputtered carbon or deposited beam species from the resolving aperture 236, beamguide 235, etc., dopant material, and/or material from the ion source 220, as well as sputtered photoresist and silicon from the workpiece 228 will tend to build up on surfaces 254. In particular, the upstream facing surface 244 of the resolving plate 236 will have a tendency to build up contaminants (not shown) after repeated low energy ion implantations into workpieces 228. Alternately, higher energy ion beams will have a tendency to sputter carbon or other contaminants to components both upstream and downstream of the resolving plate 236. Further, photoresist material from the workpieces 228 themselves may also build up on the interior surfaces of the ion implantation apparatus 200.

Conventionally build up of contaminant materials on the surfaces 254 of components 256 such as the resolving plate 236 has a tendency to eventually flake off during implantation, thus creating disadvantageous electrical discharges and particulate problems. Furthermore, contaminant build up around the resolving aperture 240 further causes desirable ions near the outer extremities of the beam path P' to strike and dislodge the built up contaminants. The dislodged contaminants can further travel to the surface of the workpiece 228, thus potentially causing various undesirable effects on the resulting implanted workpiece.

FIGS. 5-9 illustrate various views of an exemplary louvered enclosure 250, wherein the louvered enclosure has an entrance 260, an exit 262, and at least one louvered side 264 having a plurality of louvers 266 defined therein. The louvered enclosure 250, for example, is comprised of carbon, wherein contamination is minimized. In another example, the louvered enclosure 250 floats (e.g., is not electrically biased), is grounded, or is biased with respect to the ion implantation system 200. The beamline P of FIG. 3, for example, passes through the entrance 260 and exit 262 of the louvered enclosure 250 of FIGS. 5-8, wherein the plurality of louvers 266 of the at least one louvered side 264 are configured to mechanically filter the edge of an ion beam 201 of FIG. 3 traveling along the beamline P. For example, louvers 267 nearest the entrance 260 of the enclosure 250 generally provide a beam defining aperture, wherein beamstrike and subsequent sputtering and/or plating of contaminants on downstream components is minimized or eliminated.

Figure 7:
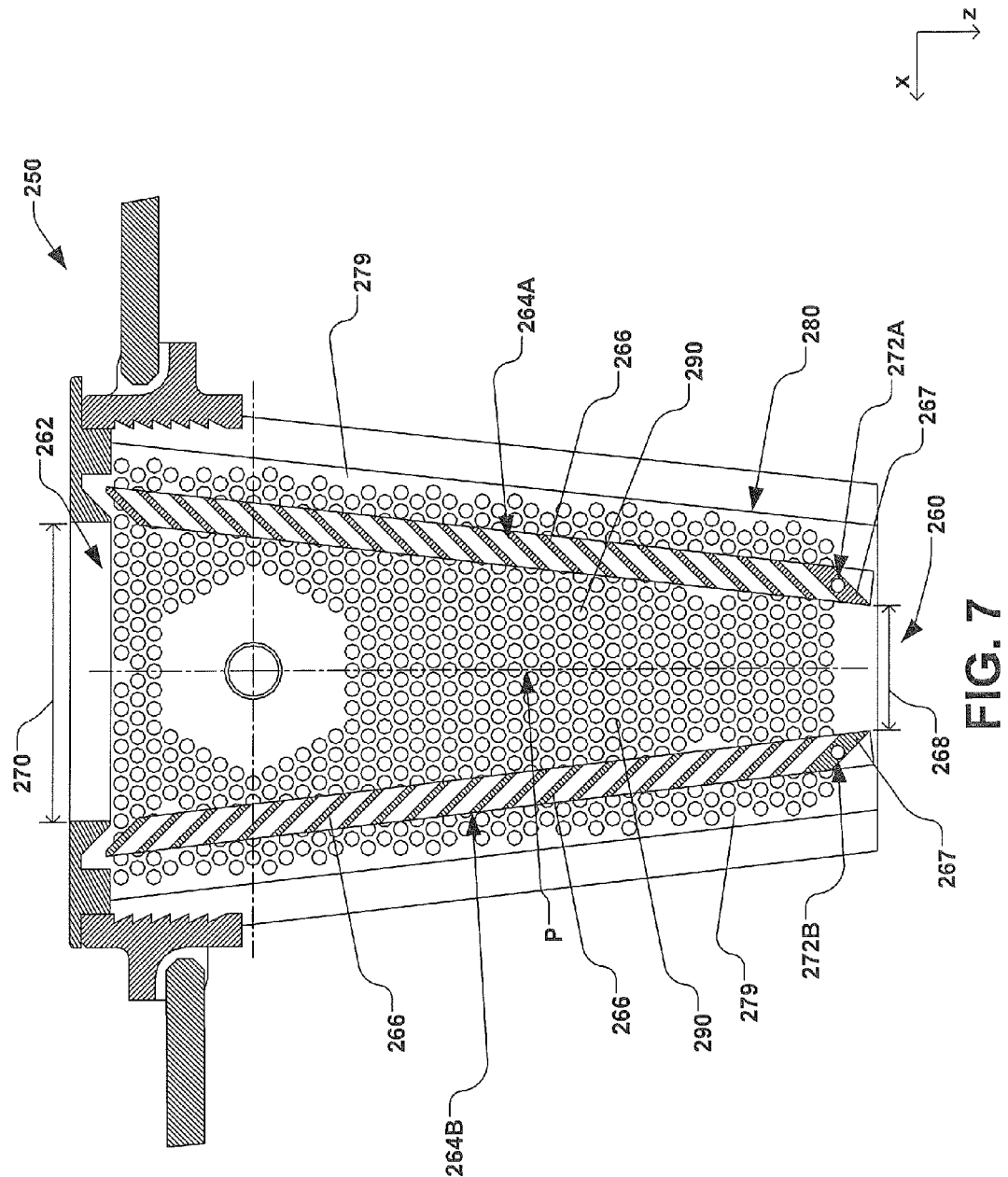
FIG. 7 is a top cross-sectional view of the louvered enclosure of FIG. 5 according to another aspect.
Figure 8:
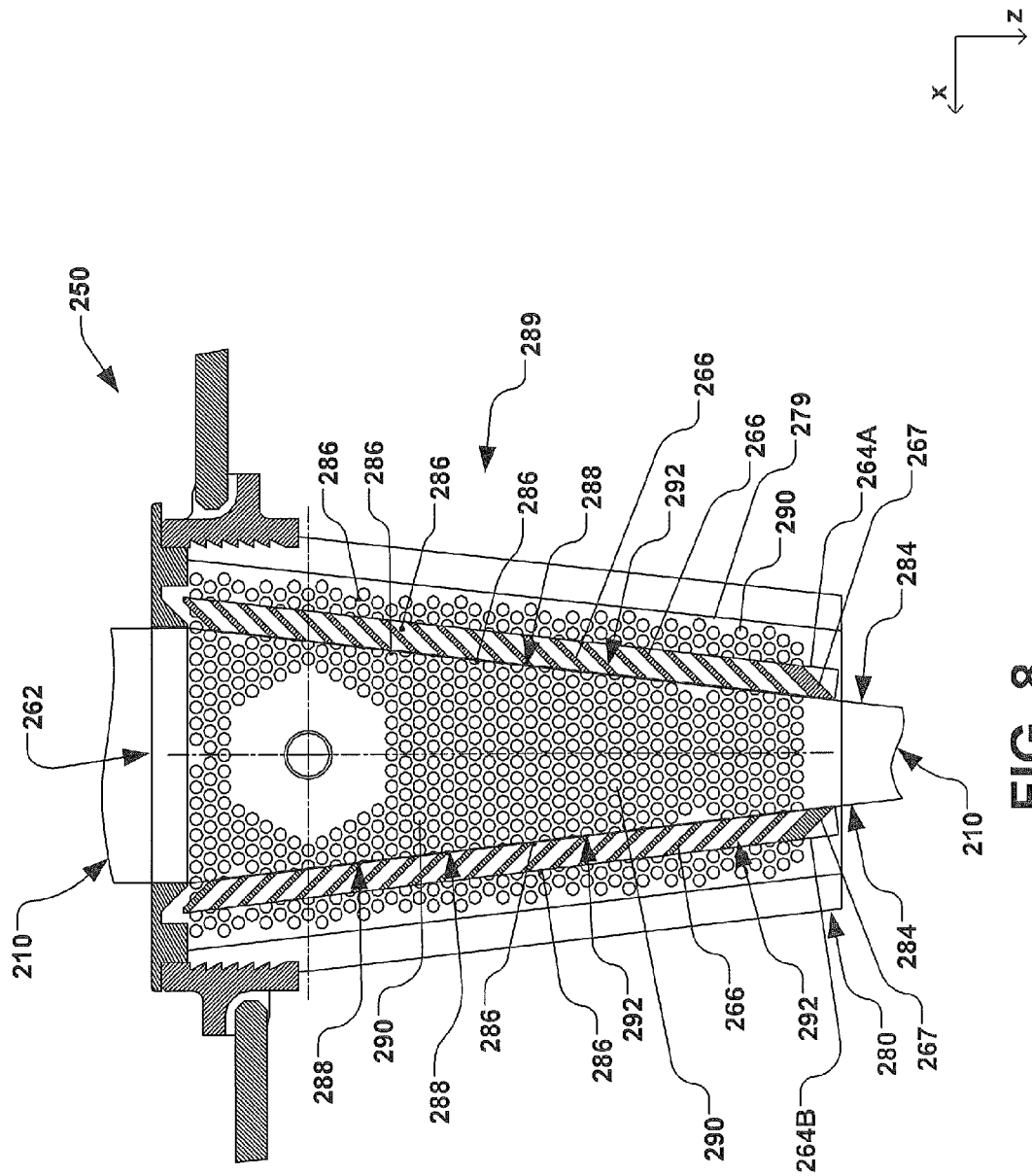
FIG. 8 is another top cross-sectional view of the louvered enclosure of FIG. 7 illustrating an ion beam passing therethrough according to another aspect of the invention.

As illustrated in FIGS. 7 and 8, for example, the enclosure 250 comprises two louvered sides 264A and 264B positioned generally opposite one another. The two louvered sides 264A and 264B lie in non-parallel planes with respect to one another. According to the present example, a width 268 of the entrance 260 of the enclosure 250 is generally defined by a width of the ground aperture 248 of FIG. 3 upstream of the enclosure, and a width 270 of the exit 262 of the enclosure generally defines an exit aperture of the beamline P immediately upstream of the workpiece 228 of FIG. 3. Respective widths 268 and 270 of the entrance 260 and exit 262 of the enclosure 250 of FIG. 7, for example, when measured perpendicular to the beamline P (e.g., along the X-coordinate), are thus generally defined by a position of the two louvered sides 264A and 264B with respect to one another.

In accordance with another example, at least one of the louvered sides 264A and 264B is adjustably mounted, wherein the width 268 and 270 of one or more of the entrance 260 and exit 262 of the enclosure 250 is selectively adjustable. For example, each of the two louvered sides 264A and 264B comprise a respective pivot axis 272A and 272B associated with the entrance 260 of the enclosure, as illustrated in FIG. 7, wherein the two louvered sides are configured to pivot about the respective pivot axis, therein controlling the width 270 of the exit of the enclosure. The pivoting of the louvered sides 264A and 264B, for example, is manually controlled or controlled by the controller 128 of FIG. 3 via a servo mechanism (not shown) operably coupled to the louvered sides. Accordingly, louvered sides 264A and 264B are configured to selectively mechanically filter respective edges of the ion beam 210 of FIG. 3 passing through the louvered enclosure 250.

Figure 5:
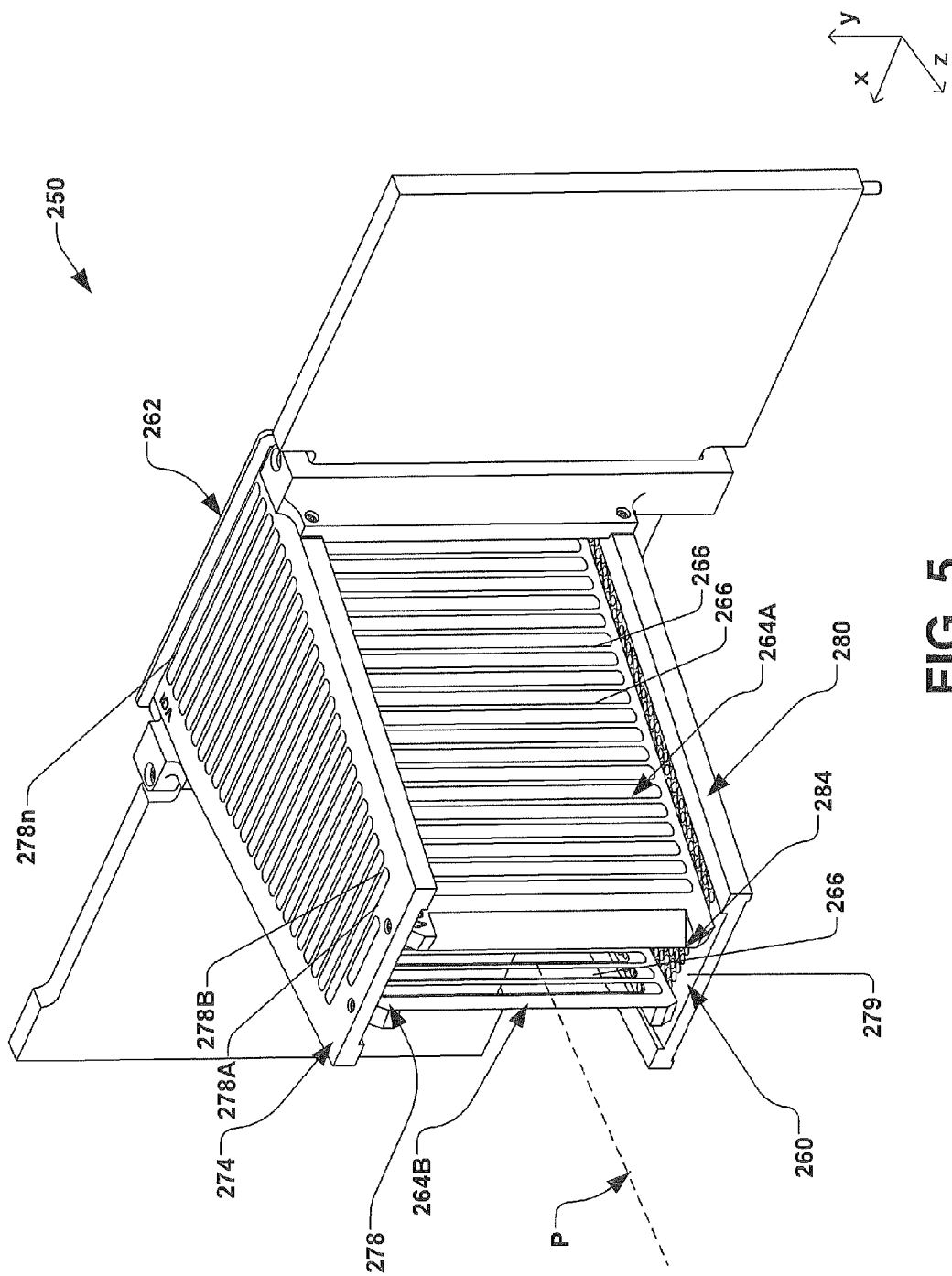
FIG. 5 is a perspective view of an exemplary louvered enclosure in accordance with still another aspect of the invention.
Figure 6:
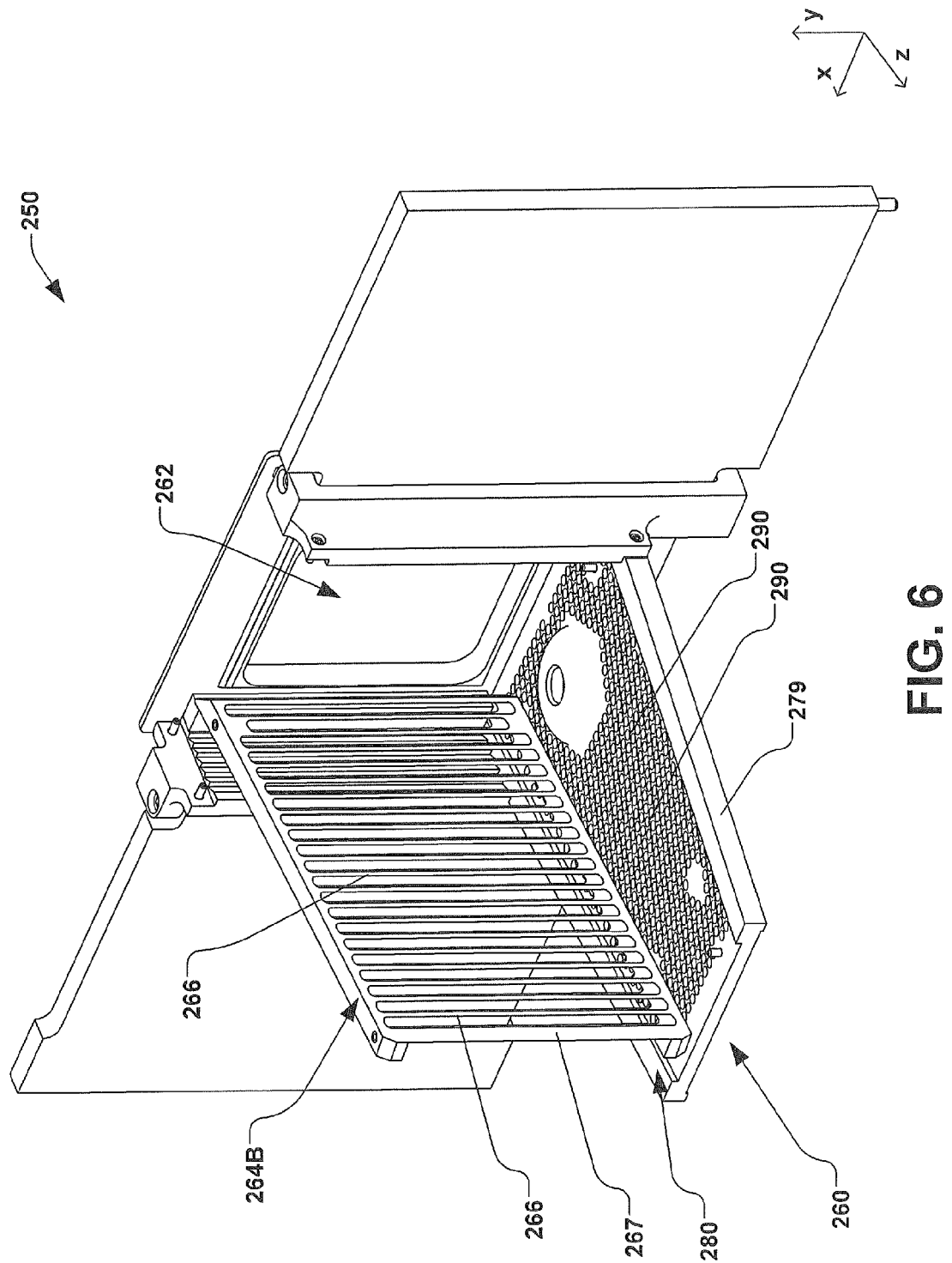
FIG. 6 is a perspective view of the louvered enclosure of FIG. 5 having a top and side removed.

In accordance with another exemplary aspect of the invention, as illustrated at least in FIG. 5, the louvered enclosure 250 further comprises a top side 274 generally enclosing a top portion 276 of the enclosure between the two louvered sides 264A and 264B. The top side 274, in one example, further comprises a plurality of vanes or louvers 278 (e.g., illustrated as 278a . . . 278n, where n is any positive integer) defined therein. In a manner similar to the louvers 266 of the louvered sides 264A and 264B, the louvers 278 of the top side 274 are configured to mechanically filter a top edge (not shown) of the ion beam 210 of FIG. 3 passing through the louvered enclosure 250.

According to yet another exemplary aspect, the louvered enclosure 250 of FIG. 5, for example, comprises a bottom side 279, wherein the bottom side generally encloses a bottom portion 280 of the enclosure between the two louvered sides 264A and 264B. In one embodiment, the louvered sides 264A and 264B, the top side 274, and the bottom side 280 of the louvered enclosure 250, for example, are configured to generally minimize electron losses from the louvered enclosure when the louvered enclosure is utilized as a PEF enclosure 252. For example, one or more electrodes (not shown, located in region 281 of FIG. 9) are configured to apply a voltage to the 210 ion beam within the plasma electron flood enclosure 252, therein controlling a space charge of the ion beam 210 therein and providing electrons thereto, as will be understood by one skilled in the art. Accordingly, the PEF enclosure 252 generally confines ions of the ion beam 210 and ions from a PEF arc chamber (not shown, located in region 281 of FIG. 9) from accelerating towards any other high voltage feedthroughs (not shown) in the proximity of the PEF enclosure.

Figure 9:
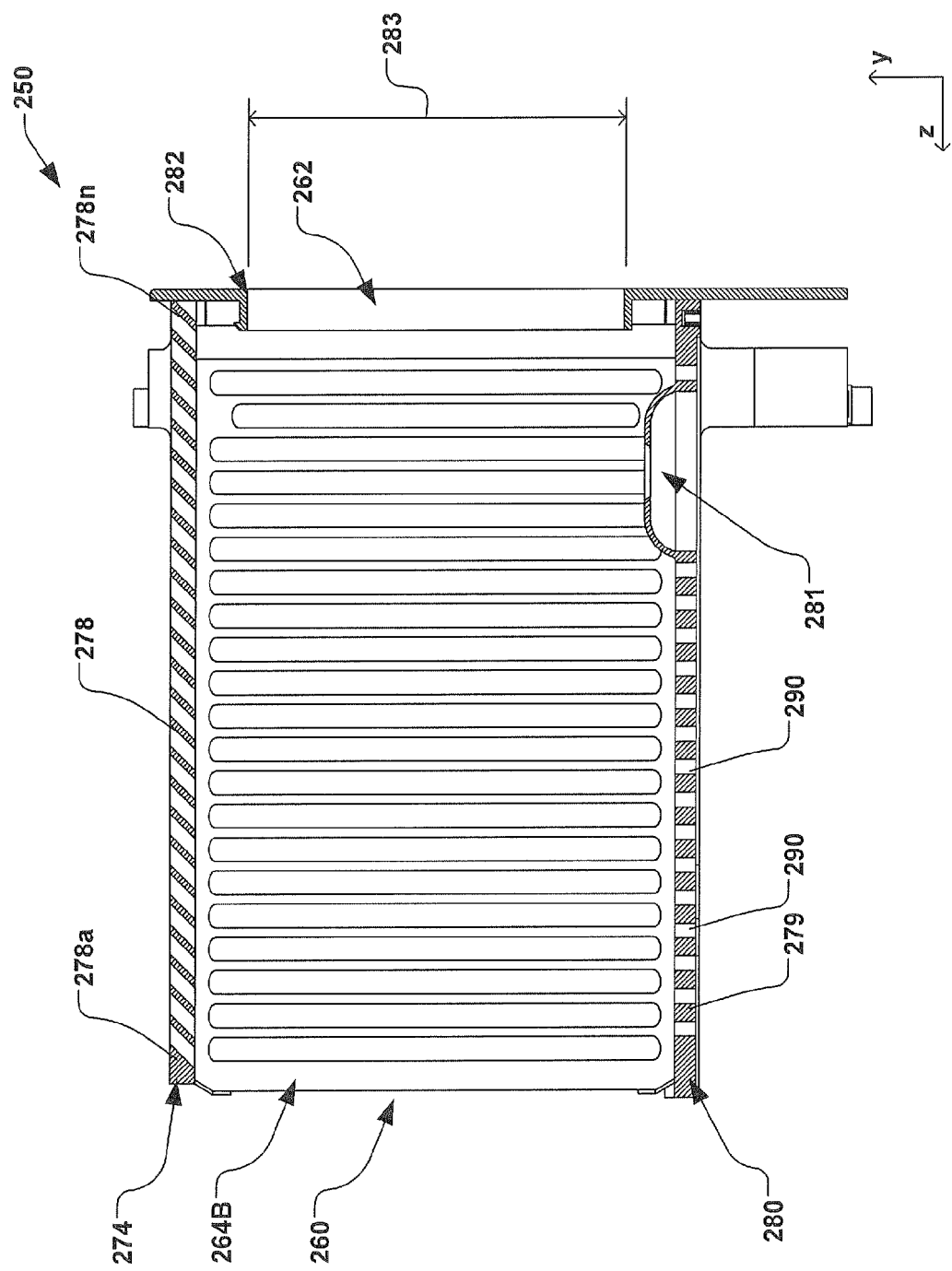
FIG. 9 is a side cross-sectional view of the louvered enclosure of FIG. 5 according to yet another aspect.
Figure 10:
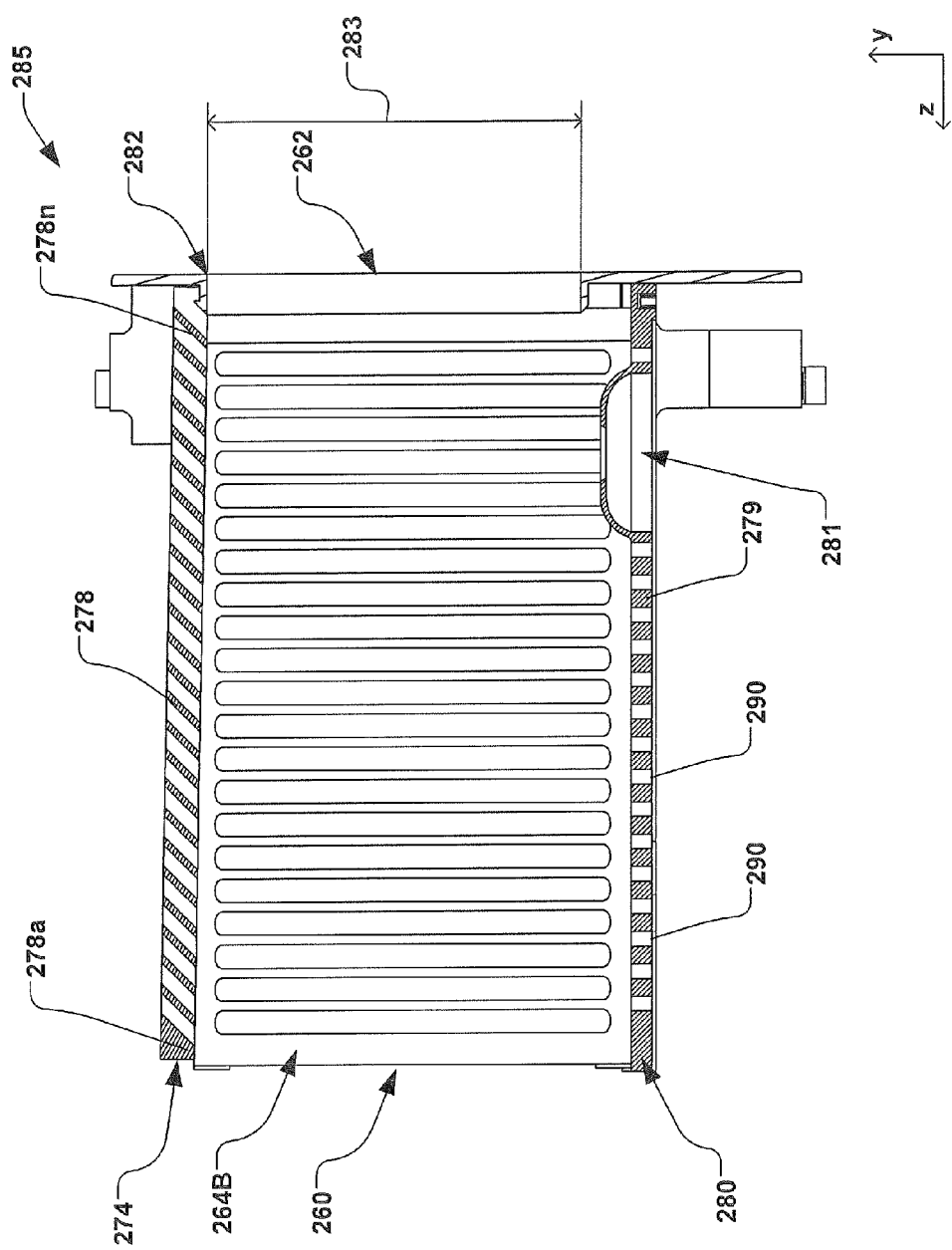
FIG. 10 is another side cross-sectional view of another exemplary louvered enclosure having a slanted top side.

According to yet another example, a top 282 of the exit aperture 262, as illustrated in FIG. 9, for example, is generally defined by one or more of the top side 274 of the louvered enclosure 250 and the exit aperture. According to one example, the furthest downstream louver 278n of the top side 274 generally defines a height 283 of the exit aperture 262, as illustrated in FIG. 10. In the louvered enclosure 285 of FIG. 10, for example, the top side 274 is non-parallel with the bottom side 279. Alternatively, the height 283 of the exit aperture 262 is defined by the exit aperture, itself, wherein the top side 274 is generally in a parallel plane as the bottom side 279, as illustrated in FIG. 9. In yet another example, the first louver 278a of the top side 274 is on the same plane as the top of the ground aperture 248 of FIG. 3. In still another alternative, the top side 274 comprises a contiguous, non-perforated plate (not shown).

During operation, the ion beam 210, as illustrated in FIG. 8, for example, passes through the louvered enclosure 250, wherein edges 284 of the ion beam are mechanically filtered or clipped via the plurality of louvers 266. The plurality of louvers 266 thus safely direct particulate contamination 286 (e.g., illustrated in FIG. 7) from within the louvered enclosure 250 to an external environment 289. However, over time, build-up of particulate contamination 286 can occur on edges 288 of the louvers 266, wherein delamination of the particulate contamination is a potential concern downstream of the louvered enclosure 250. Thus, in accordance with another exemplary aspect, the bottom side 280 comprises a plurality of perforations 290, as illustrated in FIGS. 7-10. The plurality of perforations 290, for example, generally the permit particle contamination 286 that delaminates from surfaces 292 of the louvered enclosure 250 to fall (e.g., via gravity) through the plurality of perforations to the external environment 289, thus advantageously lessening the possibility of the particle contamination from being transferred to the workpiece 228 of FIG. 3.

In accordance with yet another exemplary aspect, the plurality of louvers 266 of FIGS. 5-10 are angled less than approximately 90 degrees with respect to the beamline P when measured in a direction of travel of the ion beam (e.g., the ion beam 210 of FIG. 8). In one particular example, the plurality of louvers are angles between approximately 45 degrees and 55 degrees with respect to the beamline P. Thus, the particulate contamination 286 is directed outwardly from the louvered enclosure 250, wherein momentum generally transports the particulate contamination (as well as filtered edges 284 of the ion beam) to the external environment 289.

Figure 11:
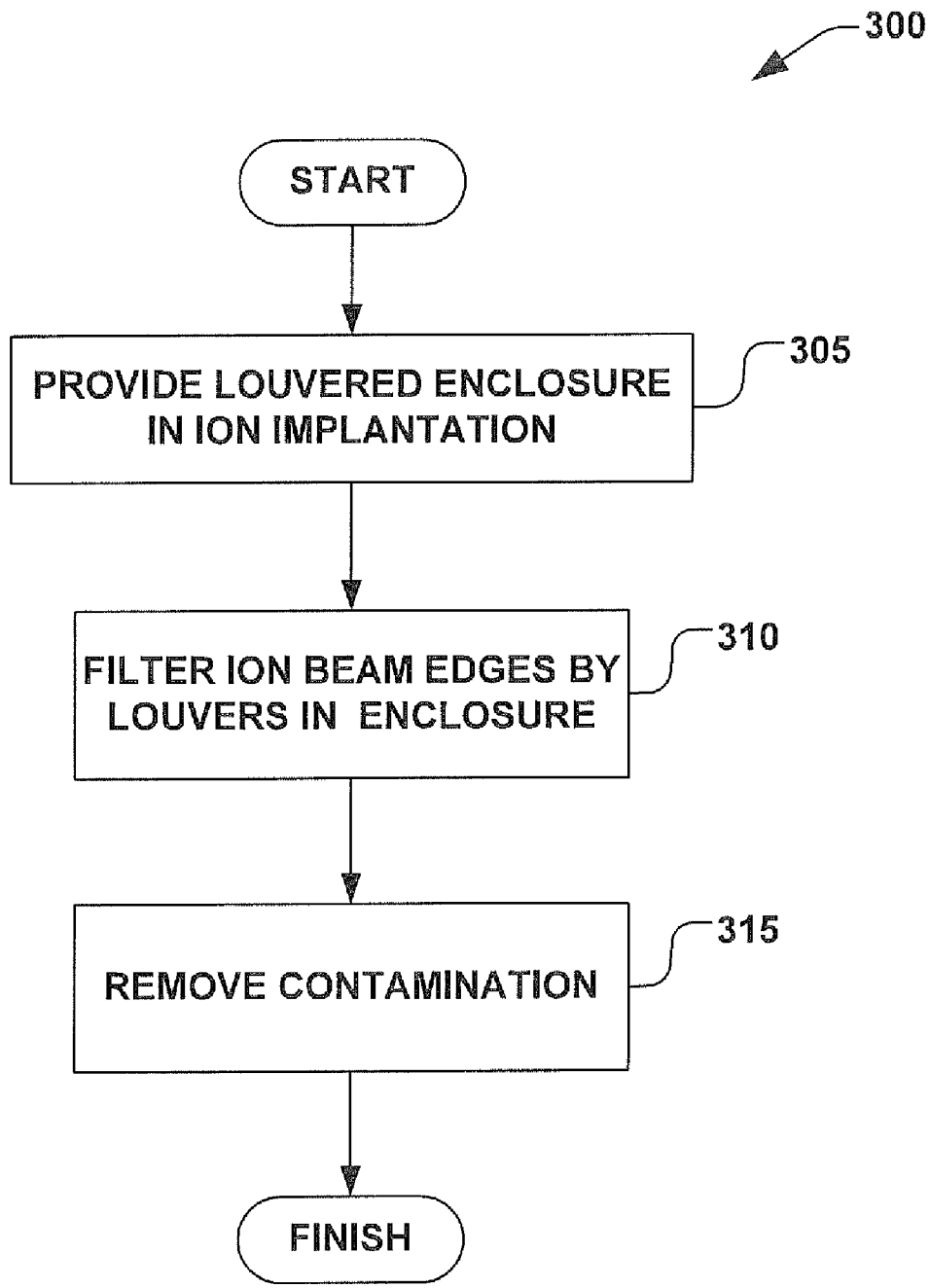
FIG. 11 is a block diagram of an exemplary method for reducing particle contamination during an implantation of ions into one or more workpieces according to another exemplary aspect of the invention.

In accordance with another aspect of the present invention, FIG. 11 illustrates a exemplary method 300 for reducing particle contamination imparted to a workpiece in an ion implantation system. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 11, the method 300 begins with providing an ion implantation system in act 305, wherein the ion implantation system is configured to implant ions into the one or more workpieces via an ion beam, such as the ion implantation system 100 or 200 of FIGS. 2-4. The ion implantation system comprises an enclosure configured to reside along a beamline of the ion implantation system, wherein the enclosure has an entrance, an exit, and at least one louvered side having a plurality of louvers defined therein, such as the enclosure 250 of FIGS. 5-9 and/or the louvered enclosure 285 of FIG. 10.

In act 310 of FIG. 11, the ion beam is passed through the entrance and exit of the enclosure, wherein the plurality of louvers of the at least one louvered side mechanically filter an edge of the ion beam. In act 315, one or more contaminants associated with the mechanical filtering of the ion beam is removed from the enclosure. The one or more contaminants, for example, are further isolated from the ion implantation system once they pass through a bottom side of the enclosure, such as via the perforations 290 of FIGS. 7-10. In another example, a position of at least one of the louvered sides controlled, therein controlling the width of one or more of the entrance and exit of the enclosure, and thus controlling a width of the ion beam exiting the enclosure.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An apparatus for reducing particle contamination in an ion implantation system, the apparatus comprising an enclosure configured to reside along a beamline of the ion implantation system, wherein the enclosure has an entrance, an exit, and at least one louvered side having a plurality of louvers defined therein, wherein the beamline passes through the entrance and exit, and wherein the plurality of louvers of the at least one louvered side are configured to mechanically filter an edge of an ion beam traveling along the beamline.

2. The apparatus of claim 1, wherein the enclosure comprises two louvered sides positioned generally opposite one another.

3. The apparatus of claim 2, wherein respective widths of the entrance and exit of the enclosure, when measured perpendicular to the beamline, are generally defined by a position of the two louvered sides with respect to one another.

4. The apparatus of claim 3, wherein at least one of the louvered sides is adjustably mounted, wherein the width of one or more of the entrance and exit of the enclosure is adjustable.

5. The apparatus of claim 4, wherein two louvered sides comprise a respective pivot axis associated with the entrance of the enclosure, wherein the two louvered sides are configured to pivot about the respective pivot axis, therein controlling the width of the exit of the enclosure.

6. The apparatus of claim 3, wherein the two louvered sides lie in non-parallel planes with respect to one another.

7. The apparatus of claim 6, wherein the width of the entrance of the enclosure is generally defined by a width of an aperture upstream of the enclosure, and wherein the width of the exit of the enclosure generally defines an exit aperture of the beamline immediately upstream of a workpiece.

8. The apparatus of claim 3, wherein the width of the entrance is less than the width of the exit.

9. The apparatus of claim 2, further comprising a top side generally enclosing a top portion of the enclosure between the two louvered sides.

10. The apparatus of claim 9, wherein the top side comprises a non-perforated plate.

11. The apparatus of claim 9, wherein the top side comprises a top louvered side having a plurality of louvers defined therein.

12. The apparatus of claim 11, wherein one or more of the plurality of louvers in the top side nearest the exit defines a top of an exit aperture.

13. The apparatus of claim 11, wherein one or more of the plurality of louvers in the top side nearest the entrance are at the same height as an upstream aperture.

14. The apparatus of claim 2, further comprising a bottom side generally enclosing a bottom portion of the enclosure between the two louvered sides.

15. The apparatus of claim 14, wherein the bottom side comprises a plurality of perforations.

16. The apparatus of claim 1, wherein the plurality of louvers are angled less than approximately 90 degrees with respect to the beamline when measured in a direction of travel of the ion beam.

17. The apparatus of claim 1, wherein the enclosure is comprised of carbon.

18. The apparatus of claim 1, wherein the enclosure comprises a plasma electron flood enclosure, wherein one or more electrodes are configured to apply a voltage to the ion beam within the plasma electron flood enclosure, therein controlling a charge of the ion beam therein.

19. The apparatus of claim 1, wherein at least one of the at least one louvered sides is adjustably mounted, wherein a width of one or more of the entrance and exit of the enclosure is adjustable.

20. The apparatus of claim 1, wherein the enclosure is not electrically, grounded or biased with respect to the ion implantation system.

21. A method for reducing particle contamination during an implantation of ions into one or more workpieces, the method comprising:
providing an ion implantation system for implanting ions into the one or more workpieces via an ion beam, wherein the ion implantation system comprises an enclosure configured to reside along a beamline of the ion implantation system, wherein the enclosure has an entrance, an exit, and at least one louvered side having a plurality of louvers defined therein; and
passing the ion beam through the entrance and exit of the enclosure, wherein the plurality of louvers of the at least one louvered side mechanically filter an edge of the ion beam and remove one or more contaminants from the beamline.

22. The method of claim 21, wherein the enclosure comprises two louvered sides positioned generally opposite one another, and wherein respective widths of the entrance and exit of the enclosure, when measured perpendicular to the beamline, are generally defined by a position of the two louvered sides with respect to one another, the method further comprising:
controlling a position of at least one of the louvered sides, therein controlling the width of one or more of the entrance and exit of the enclosure.

23. The method of claim 22, wherein the enclosure further comprises a bottom side generally enclosing a bottom portion of the enclosure between the two louvered sides, and wherein the bottom side comprises a plurality of perforations therethrough, wherein gravity forces the one or more contaminants to pass through the plurality of perforations, the method further comprising:
isolating the one or more contaminants from the ion implantation system once they pass through the bottom side of the enclosure.

* * * * *